United States Patent [19]
Minoda et al.

[11] Patent Number: 5,661,425
[45] Date of Patent: Aug. 26, 1997

[54] DIGITAL PLL CIRCUIT

[75] Inventors: Hidenori Minoda; Hiroyuki Matsuoka; Katsuaki Matsufuji, all of Higashihiroshima, Japan

[73] Assignee: Sharp Kabushiki Kaisha, Osaka, Japan

[21] Appl. No.: 440,977

[22] Filed: May 15, 1995

[30] Foreign Application Priority Data

| Jun. 20, 1994 | [JP] | Japan | 6-136942 |
| Dec. 13, 1994 | [JP] | Japan | 6-308557 |
| Dec. 27, 1994 | [JP] | Japan | 6-324307 |

[51] Int. Cl.$^6$ .................................................. H03K 5/13
[52] U.S. Cl. .......................... 327/159; 327/160; 327/156; 327/150; 327/147; 327/151; 331/1 A; 375/376
[58] Field of Search ............................ 327/147, 148, 327/149, 150, 151, 156, 157, 158, 159, 160; 331/1 A, 25, 17, 14; 375/376, 371, 373, 327

[56] References Cited

U.S. PATENT DOCUMENTS

| 4,019,153 | 4/1977 | Cox et al. | 331/1 A |
| 4,538,119 | 8/1985 | Ashida | 331/1 A |
| 4,827,225 | 5/1989 | Lee | 331/1 A |
| 5,111,151 | 5/1992 | Ii | 331/1 A |

FOREIGN PATENT DOCUMENTS

| 0 315 489 | 11/1988 | European Pat. Off. . |
| 0 571 148 A1 | 5/1993 | European Pat. Off. . |
| 60-171680 | 9/1985 | Japan . |
| 1-303630 | 12/1989 | Japan . |
| 3-212860 | 9/1991 | Japan . |
| 3-235270 | 10/1991 | Japan . |
| 3-289820 | 12/1991 | Japan . |
| 4-192925 | 7/1992 | Japan . |

*Primary Examiner*—Timothy P. Callahan
*Assistant Examiner*—Dinh T. Le
*Attorney, Agent, or Firm*—Nixon & Vanderhye P.C.

[57] ABSTRACT

A phase control circuit adjusts the width of a PLL clock signal so that a PLL clock signal generated from a master clock signal MCK is in synchronization with an EFM signal. A velocity detector detects offset in velocity by counting a pulse width of an EFM signal with a master clock signal MCK. The phase control circuit alters the pulse width of a PLL clock signal according to the detected offset in velocity to alter the average frequency of a PLL clock signal in proportion to offset of the rotational speed.

17 Claims, 17 Drawing Sheets

PLLCK WIDTH ENLARGED AT ↑ FOR EVERY 8 PULSES

DIGITAL PLL CIRCUIT

BACKGROUND OF THE INVENTION

1. Field of the Invention

The present invention relates to digital PLL circuits. More particularly, the present invention relates to a digital PLL circuit used for reproducing an EFM (Eight to Fourteen Modulation) signal of a compact disc (CD) or a mini disc (FID).

2. Description of the Background Art

An analog PLL circuit for reproduction associated with a CD or a MD is disclosed in, for example, Japanese Patent Laying-Open Nos. 1-303630 and 3-212860. The phase difference between an input signal and a PLL clock signal generated by a PLL circuit is converted into voltage. The frequency of the PLL circuit is varied using a voltage-frequency conversion circuit to achieve synchronization. A digital PLL circuit operating under a similar principle is disclosed in Japanese Patent Laying-Open No. 3-289820, for example.

In the above-mentioned analog PLL circuit, the process of switching a gain requires the operation of switching the resistance of an operational amplifier that converts the phase difference into a voltage. This will increase the circuit complexity, and the problem of temperature characteristics is noticeable. In a conventional digital PLL circuit, a digital control oscillator is required. It was very difficult to incorporate this portion into an LSI.

SUMMARY OF THE INVENTION

In view of the foregoing, an object of the present invention is to provide a digital PLL circuit that can be integrated at high density into an LSI and that can have a gain switched according to signal quality.

According to the present invention, the phase difference between a clock signal which is a frequency-divided version of a signal with fixed frequency and an input signal is counted. Synchronization between an input signal and a clock signal is obtained by controlling the frequency rate according to the phase difference. The relationship of a frequency rate with respect to phase difference can be set to a variable value.

Thus, frequency synchronization can be realized by controlling the frequency rate based upon the phase difference between a clock signal and an input signal. The relationship of phase difference versus frequency rate is arranged in a table to obtain an optimum value according to signal quality, for example, the level of jitter.

Preferably, the relationship of phase difference versus frequency rate is made variable according to the quality of an input signal, or the phase difference versus frequency rate is set to an optimum value according to the level of jitter of an input signal.

Preferably, a changing point of a clock signal is adjusted at units of half period of a fixed frequency, or the phase difference of an input signal and a clock signal is counted using both a rise and fall of a fixed frequency and then added in order to set variable the relationship of phase difference versus frequency rate.

More preferably, an output changing timing of a clock signal is delayed by half a period of a fixed frequency by a value of phase difference, or selected from a rise or fall of a fixed frequency by a value of phase difference.

In a more preferred embodiment, offset of an input signal from a standard transfer rate is detected according to a counted pulse width of an input signal. The frequency rate is changed to alter the average frequency, whereby the lock range/capture range is increased. Also, the value of the relationship of phase difference versus frequency rate is increased to enlarge the lock range/capture range.

According to another aspect of the present invention, a digital PLL circuit counts the phase difference between a clock signal which is a frequency-divided version of a signal of fixed frequency and an input signal. By controlling the frequency rate according to the phase difference, synchronization between an input signal and a clock signal is obtained. The pulse width of an input signal is counted and detection is made whether the pulse width is within a predetermined width of 3T–11T. The amount of offset of an input signal from a standard transfer rate is added according to the counted pulse width. This added value is divided by an added value of the detected pulse width, whereby offset of an input signal from a standard transfer rate is detected.

According to the present invention, a digital PLL circuit can be provided with a complete logic circuit. Integration into an LSI at high density is allowed. By setting variable the relationship of phase difference versus frequency rate, the relationship of phase difference versus frequency rate can be set to an optimum value according to the jitter level of an input signal. Therefore, reproduction that is reduced in error can be obtained.

In a more preferable embodiment, an input signal is invalidated in response to detection of a signal having a pulse width in the vicinity of the middle of each T.

Preferably, the phase correction operation of an input signal at the next period is suppressed when a signal having a pulse width smaller than 3T is detected.

In a more preferred embodiment, the level of offset of an input signal from a standard transfer rate is determined at a plurality of stages. The frequency of change of the frequency rate is varied according to each determined stage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
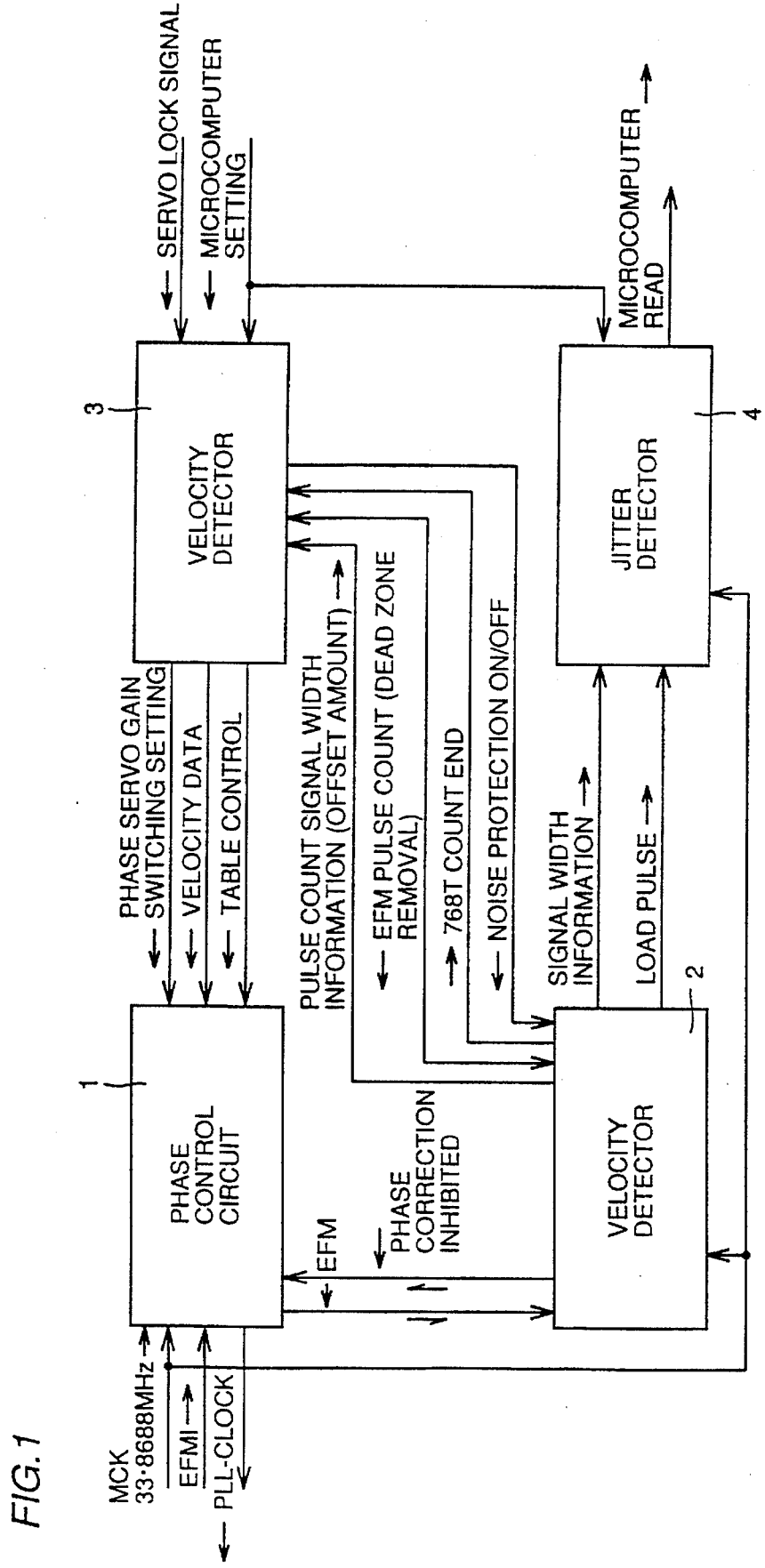
FIG. 1 is a block diagram showing a structure of an entire PLL circuit according to an embodiment of the present invention.
Figure 2:
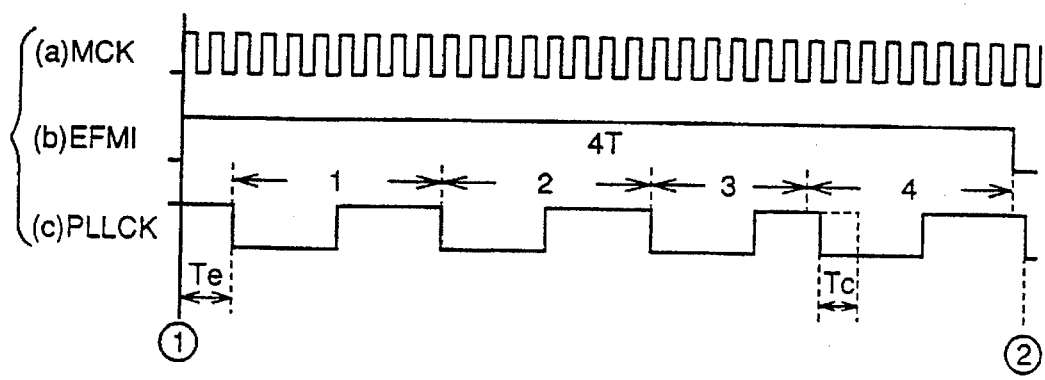
FIG. 2 is a timing chart of a master clock signal MCK, an EFMI signal, and a PLL clock signal.
Figure 3:
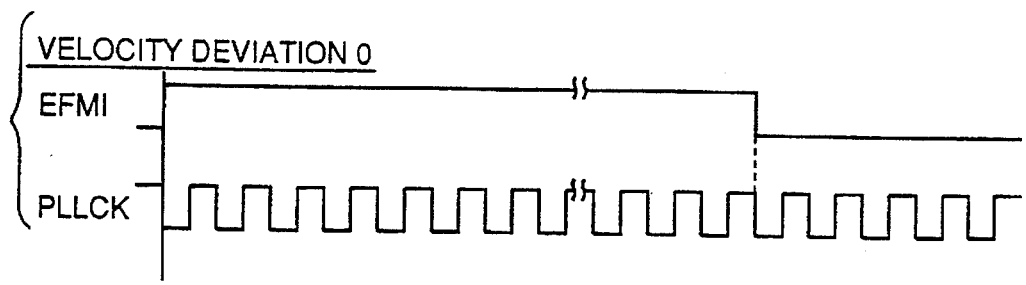
FIGS. 3(a) and 3(b) are timing charts of an EFMI signal and a PLL clock signal.
Figure 3:
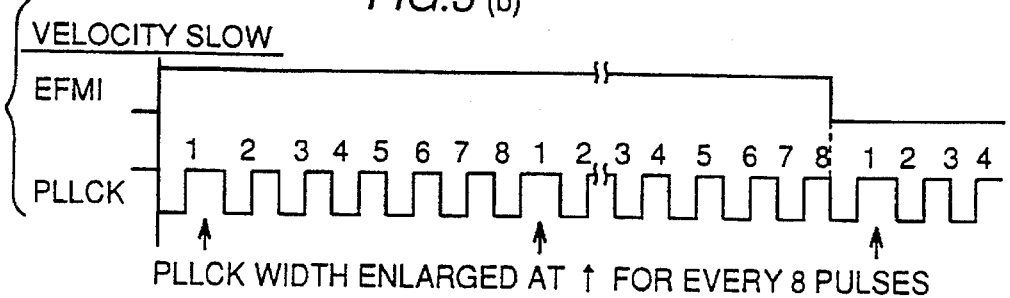

Referring to FIGS. 1–3, the structure of a PLL circuit according to an embodiment of the present invention will be described hereinafter. A digital PLL circuit includes a phase control circuit 1, velocity detectors 2 and 3, and a jitter detector 4. The digital PLL circuit generates a PLL clock signal as a synchronization clock from a reproduced EFM signal from a CD or a MD. EFM is a signal of a width of 3T–11T where $$1T=236.2 \text{ [nSEC]}$$

$$MCK=33.8688 \text{ [MHz]}$$

The length of 1T is 8 clocks of MCK:

Phase control circuit 1 receives externally applied master clock signal MCK and EFM signal. Phase control circuit 1 generates a PLL clock signal shown in FIG. 2 (c) from master clock signal MCK shown in FIG. 2 (a). The pulse width of a PLL clock signal is adjusted so that the generated PLL clock signal and the EFM signal shown in FIG. 2 (b) synchronize. More specifically, phase control circuit 1 counts the time from an edge (rising or falling) of an EFM signal to the falling edge of a PLL clock signal which is generally generated by a master clock signal MCK frequency-divided by a factor of 8. According to this count value (Te of FIG. 2 (c)) the "H" level zone of a PLL clock signal is for 3 periods. In response, the amount of phase offset shown at (1) in FIG. 2 (c) is reduced to (2). Here, Tc/Te is referred to as "phase correct gain". Phase control circuit 1 detects the deviation of the rotational speed of the disc to apply a correction process on a PLL clock signal other than the above-described phase correction of (1). The lock range is increased or the average frequency of a PLL clock signal is varied in proportion to deviation of the rotational speed by altering the width of N pulses out of eight pulses of a PLL clock signal as shown in FIG. 3 on the basis of detected velocity offset from velocity detectors 2 and 3 used in a rough servo mode.

Velocity detectors 2 and 3 detect offset of velocity by counting the pulse width of an EFM signal with a master clock signal MCK. An EFM signal has a jitter of approximately 30 nsec. The average of the amplitude of each signal of 3T–11T will exhibit an offset with respect to a logic value. This is considered to be caused by equalizing characteristics. The embodiment of FIG. 1 takes this into account. Determination of 3T–11T is made by counting the time from an edge to another edge to detect the amount of offset of the determined signal from the width at a normal speed mode. Furthermore, the detected 3T–11T are added. The offset in velocity is calculated from the added value of the detected offset amount when 768 (300 Hex) T is counted.

Jitter detector 4 derives an EFM signal that has the pulse width of 3T from those obtained by velocity detectors 2 and 3. The degree of offset of the input signal is determined by identifying how many pulses out of 1024 pulses are included in the width of a range predetermined by a microcomputer.

Figure 4:
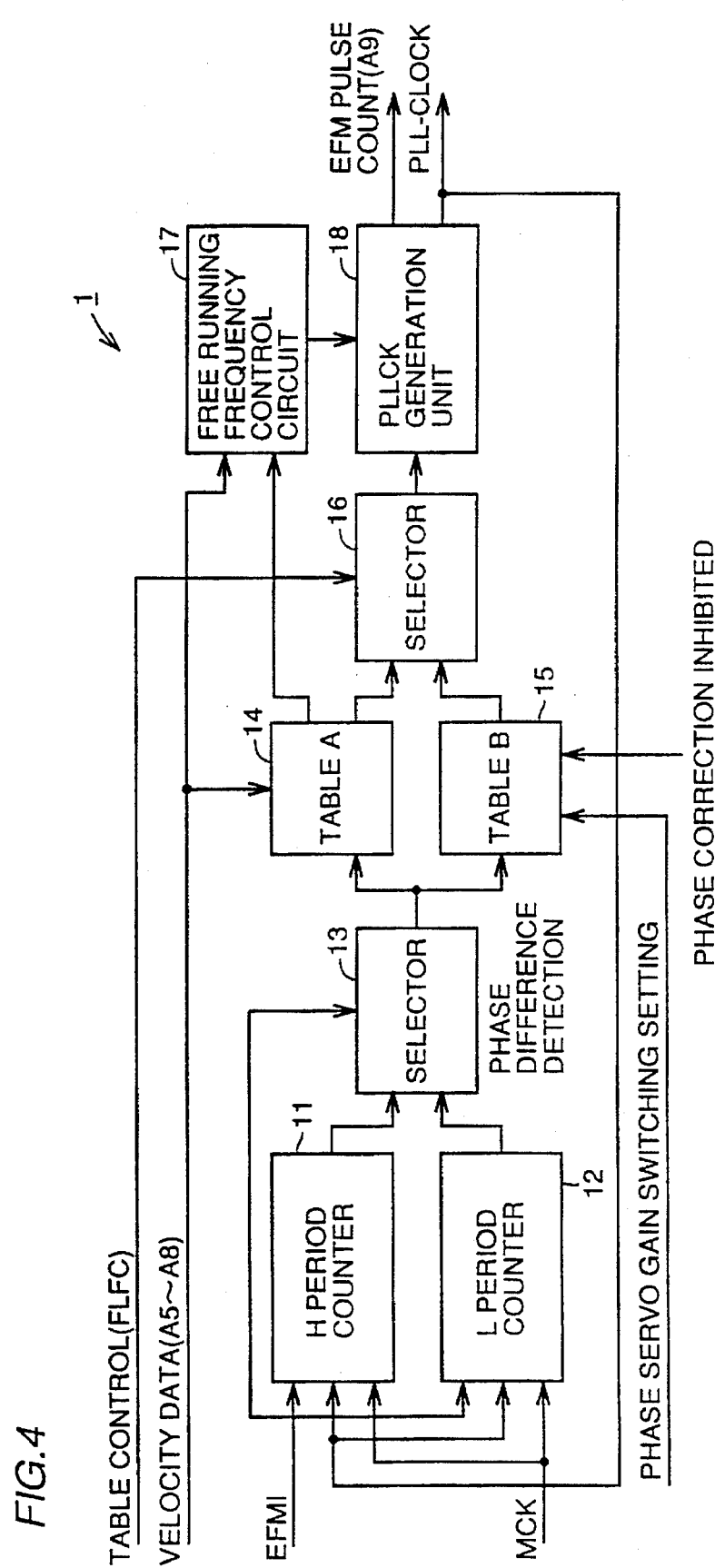
FIG. 4 is a block diagram of a phase control circuit shown in FIG. 1.

FIG. 4 is a block diagram showing a specific structure of the phase control circuit of FIG. 1. Referring to FIG. 4, counters 11 and 12 and a selector 13 form the phase difference detection, means for detecting the phase difference between an EFMI signal and a PLL clock signal. Counter 11 counts a master clock signal MCK during a period starting from the rise of an EFMI signal to an H level from an L level until a fall of a PLL clock signal to an L level. Counter 12 counts a master clock signal MCK during a period starting from a fall of an EFMI signal to an L level from an H level until a fall of a PLL clock signal to an L level. Then, the phase difference between an EFMI signal and PLL clock signal is detected. The phase difference detected by each of counters 11 and 12 is applied to selector 13.

Selector 13 selects the output of counter 11 when an EFMI signal attains an H level, and selects the output of counter 12 when the EFMI signal attains an L level. The selected phase difference is applied to tables 14 and 15 to be converted into data for correcting a PLL clock signal. More specifically, the usage of table 14 and 15 depends upon the state of a servo circuit CLV (not shown) for fixing the readout speed at a constant rate. Table 14 is used when CLV controls the rotation of a CD in a rough servo mode. Table 15 is used when CLV controls the rotation of a CD in a fine servo mode. Table 14 has correction data stored in advance. The relation between phase difference and correction data is shifted according to velocity data A5–A8 provided from velocity detector 3 at a fixed gain of ⅓.

In a rough servo mode, the velocity varies at a maximum of ±6%. Six types of gains are stored in table 15 according to the quality of an EFMI signal. The servo gain is switched according to a phase servo gain switching set signal from velocity detector 3. When a signal smaller than 1.5T is input, an occurrence of reproduced error is assumed due to a finger print or the like. Data not corrected is output when a phase correction inhibit signal is provided from velocity detector 2.

The outputs of tables 14 and 15 are provided to selector 16. Selector 16 selects and provides to a PLL clock generation unit 18 an output of either table 14 or 15 in response to a table control signal of rough servo/fine servo from velocity detector 3. PLL clock generation unit 18 generates a PLL clock signal according to an output of selector 16. A free running frequency control circuit 17 controls the frequency and timing of correcting a PLL clock signal with respect to PLL clock generation unit 18 according to velocity data and an output of table 14.

Figure 5:
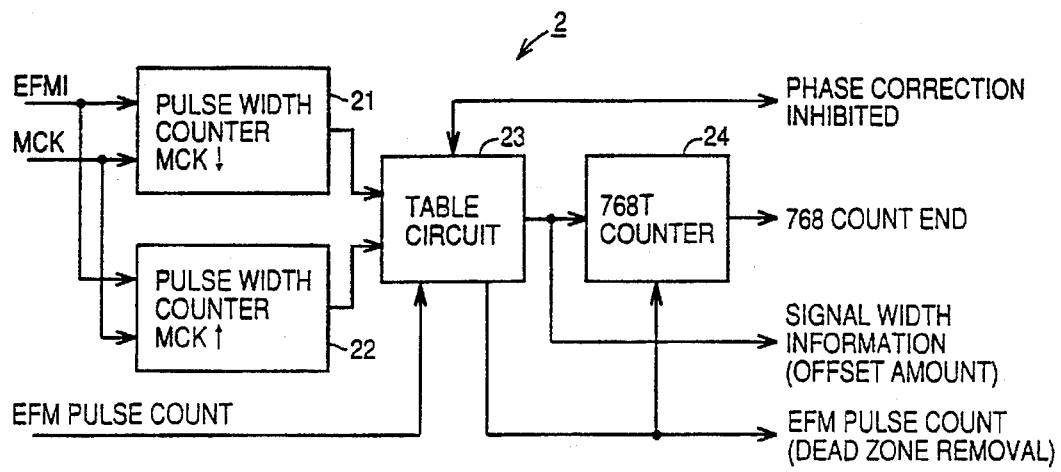
FIG. 5 is a block diagram of a velocity detector 2 shown in FIG. 1.

FIG. 5 is a block diagram showing velocity detector 2 of FIG. 1.

Referring to FIG. 5, an EFMI signal and a master clock signal MCK are provided to pulse width counters 21 and 22. Pulse width counter 21 counts the width of an EFMI signal at a falling edge of master clock signal MCK. Pulse width counter 22 counts the width of an EFMI signal at a rising edge of master clock MCK. The outputs of pulse width counters 21 and 22 are provided to a table circuit 23. Table circuit 23 functions to invalidate any EFMI signal from pulse width counters 21 and 22 that has a pulse width that is determined as not being 3T–11T. For example, when the range of offset in velocity is ±6%, a greater variation in width is exhibited as each signal of 3T–11T has a greater pulse width.

Figure 6:
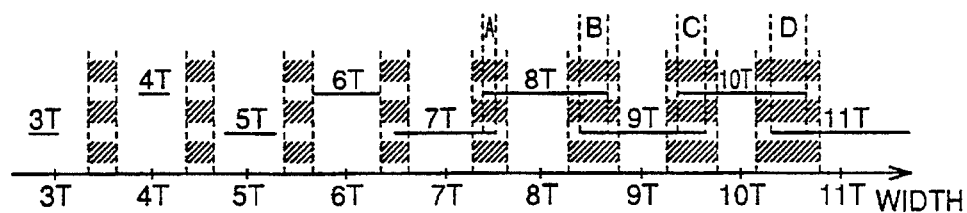
FIG. 6 is a diagram for describing the operation of the velocity detector of FIG. 5.

Referring to FIG. 6, the bold solid line indicates the changing width of a signal of each length. A–D are regions of a value achievable by a signal of adjacent T when the velocity deviation is great in the + direction and the − direction. More specifically, when a signal of a width in region D is detected, determination cannot be made whether that detected signal is a signal of 10T having a velocity deviation towards the − direction (delayed) or a signal of 11T having a velocity deviation towards the + direction (advanced). Velocity detection will exhibit a great error if the signal is assumed as either 10T or 11T. Table circuit 23 defines an invalid area indicated by the hatchings to output a special output (code FFhex). If the signal is not located in the invalid area, the signal applied to table circuit 23 is simply output. The output of table circuit 23 is provided to a 768T counter 24, and also to velocity detector 3 as signal width information indicating the amount of deviation. Although table circuit 23 provides an EFM count pulse at respective levels of H and L of an EFMI signal, it will be masked as an EFM count pulse (dead zone removal) when the pulse of the EFMI signal is located in an invalid area to be applied to velocity detector 2 as a clock signal for the addition of the amount of offset of the width of a clock. Furthermore, since there is no pulse that is essentially less than 3T, a phase correction inhibit signal is generated when an extremely thin EFMI signal is input. This phase correction inhibit signal is provided to phase control circuit 1.

Figure 7:
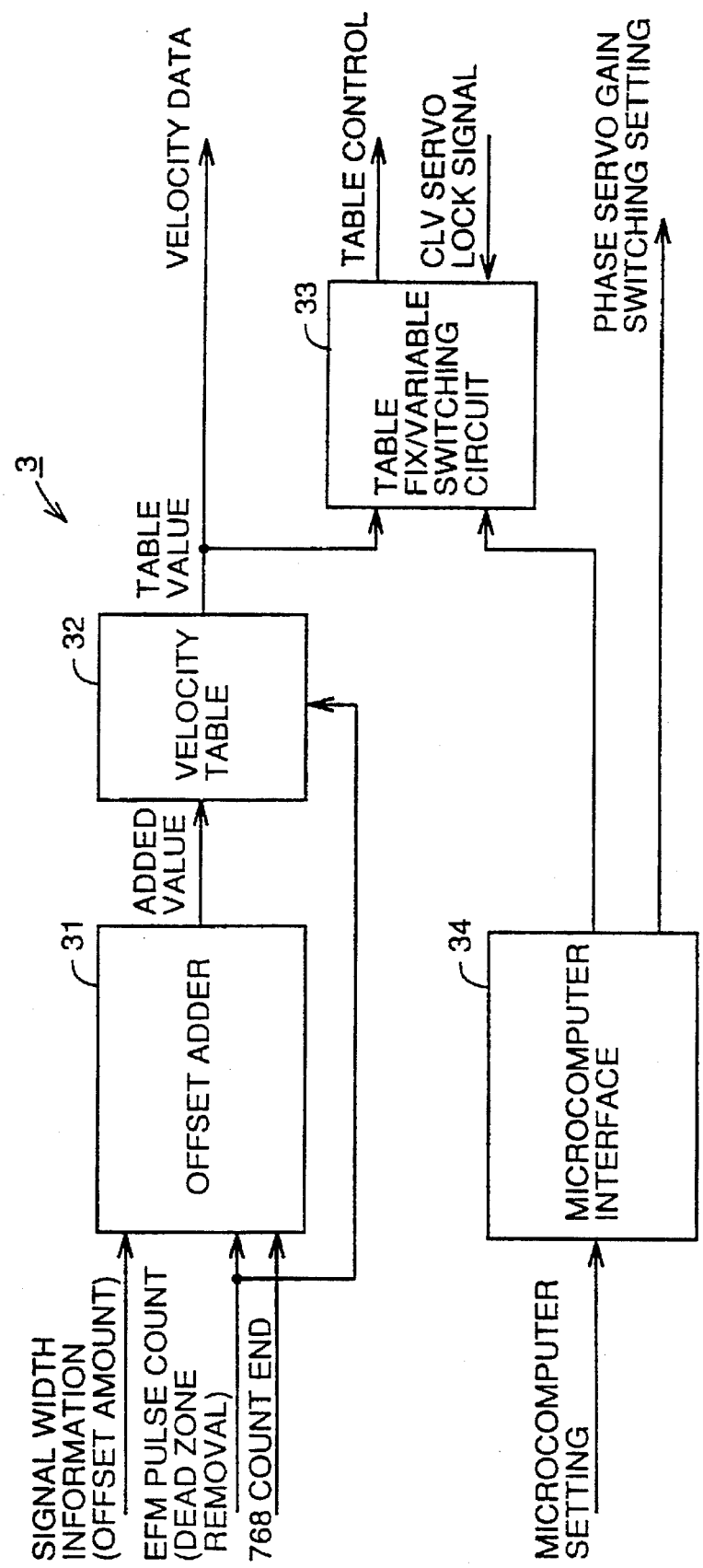
FIG. 7 is a block diagram of a velocity detector 3 shown in FIG. 1.

FIG. 7 is a block diagram of velocity detector 3 of FIG. 1. Referring to FIG. 7, an offset adder 31 receives signal width information from velocity detector 2, an EFM pulse count signal, and a 768-count complete signal. Offset adder 31 adds the signal width information. The amount of offset in velocity is identified by detecting the added value of the offset amount when the count value becomes 768. The added value of offset adder 31 is provided to velocity table 32. Seven levels of velocity are stored in velocity table 32 to increase the capture range of locking. The velocity is switched according to the added value of offset adder 3. The velocity data is provided to phase control circuit 1 and a table fix/variable switching circuit 33. Table fix/variable switching circuit 33 is mainly used for switching from a rough servo mode into a fine servo mode. Switching is effected by an externally applied CLV servo lock signal or a switching signal provided from a microcomputer via a microcomputer interface 34.

Jitter detector 4 of FIG. 1 extracts only a signal of 3T from the signal width information provided from velocity detector 2 to determine the degree of jitter from the ratio of the number of those equal to the value set by the microcomputer to the total number of 3T. According to an embodiment of the present invention, determination is made that a signal of 3T has a pulse width of 768 nsec when there is no jitter and the velocity is at standard level. More specifically, the count value of a master clock signal MCK of 33.8688 MHz is approximately 24. A default value of "24" is generally set by the microcomputer. Determination is made of reduced jitter as there are more 3T signals equal to 24. Determination can be made that the disc is eccentric if the value equal to 24 is repeatedly increased and reduced at a certain period. The microcomputer switches the phase servo gain of the phase control circuit on the basis of this information. In general, a greater jitter has a smaller gain. Therefore, the gain should be increased for a disc of greater eccentricity.

Figure 8:
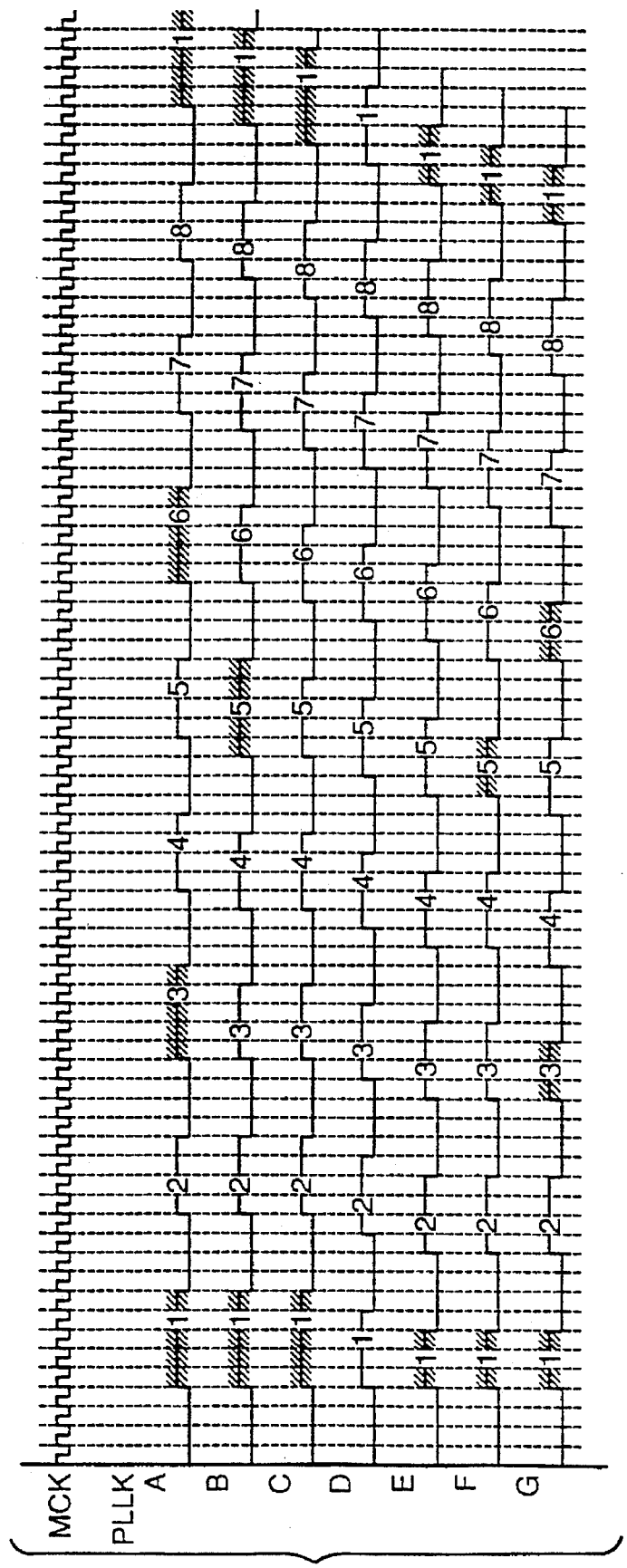
FIG. 8 is a diagram showing variation in the average frequency of a PLL clock signal.

FIG. 8 shows change in the average frequency of a PLL clock signal.

Figure 9:
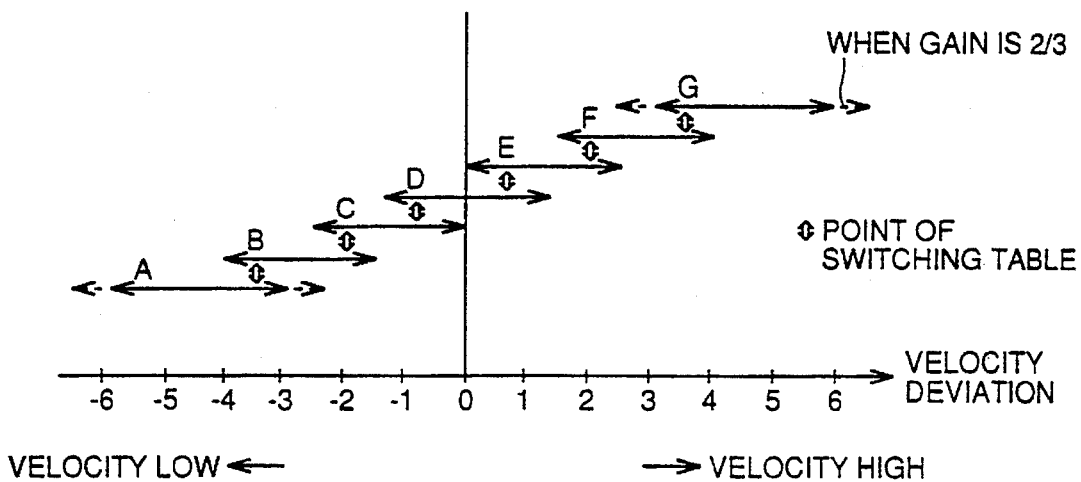
FIG. 9 shows the point of switching a table.

As shown in FIG. 8, there are seven types of changes in the average frequency of a PLL clock signal (A–G). Switching of A–G is carried out at a point of velocity deviation where each of tables A–G shown in FIG. 9 overlap. The velocity deviation is determined by counting the pulse width of an input signal. Velocity table 32 shown in FIG. 7 is stored in each of tables A–G. The gains in tables A and G are set to a great value. For example, the gains of A and G are set to ⅔, and the gains of other tables are set to ⅓. The capture/lock range is enlarged by increasing the gain. The trade off thereof is the possibility of increase in reproduced error. Tables A and G are generally used only at a rough servo mode. It is more effective to increase the capture/lock range even if error is slightly increased.

According to the present embodiment, the relationship of phase difference versus frequency rate (gain) is made variable. Therefore, the lock range/capture range can be increased without increasing the number of tables. Furthermore, detection of velocity can be made with more accuracy since all the signals of 3T–11T are used. A digital PLL circuit of the present embodiment can be formed completely of a logic circuit, and can be integrated at high density into an LSI.

According to the present embodiment, the pulse width of a PLL clock signal is counted to detect the offset of a PLL clock signal from a standard transfer rate, i.e. the offset of rotational speed of a disc, whereby the frequency rate of a frequency-divide signal is changed to alter the average frequency.

Automatic adjustment is allowed by having the set value of the frequency rate modified by a microcomputer according to the determination of signal quality read out from jitter detector 4.

In the present invention, offset of a PLL clock signal from a standard transfer rate can be detected. The pulse width of a PLL clock signal is counted to make a determination which of 3T–11T the EFM signal is. The two resultant values obtained by detecting the offset of an EFM signal from the standard transfer rate are added. This added value of the offset amount is divided by the added value of the determination results of 3T–11T. The details will be described hereinafter.

An EFM signal is counted from one edge to another edge at both edges of a master clock signal MCK. The amount of offset from a logic value which is to be detected at normal speed is converted into an amount of offset of frequency. An approach of obtaining an average on the basis of a sufficient number of times of M is considered.

The width of nT (n=3–11) is expressed as below according to variation in the revolution speed:

width=nT/N (n=3–11, N=[ratio with respect to rotational speed of regular speed])

The width in frequency is expressed as:

$$f_{Nn} = N/2nT \tag{1}$$

The amount of variation of frequency from a general mode (regular speed) is:

$$\frac{f_{Nn}-f_{1n}}{f_{1n}} = \frac{\frac{N}{2nT}-\frac{1}{2nT}}{\frac{1}{2nT}} = N-1 \quad (2)$$

In practice, $f_{Nn}$ is measured and $f_{1n}$ is treated as a constant. The value is added for a great number of times of M to sufficiently eliminate deviation due to quantization error and jitter. The average value is taken as frequency offset. More specifically, $$\frac{f_N-f_1}{f_1} = \sum_{n=3}^{M} P_n \left[\frac{f_{Nn}-f_{1n}}{f_{1n}}\right]_{mean}$$

where $$P_n = \frac{\text{number of times of } nT \text{ generation}}{M} \quad (3)$$

$\approx$ generation probability of $nT$ $$[F_n]_{mean} = \frac{F_{n1}+F_{n2}+\ldots+F_{nl}}{\text{number of times of } nT \text{ generation } (=l)}$$

= average of $F_n$

By taking a great value of M, we have:

$$\left[\frac{f_{Nn}-f_{1n}}{f_{1n}}\right]_{mean} \approx N-1$$

from the above equation (2). Also, since we have:

$$\sum_{n=3}^{n} P_n = 1,$$

the following is obtained from equation (3):

$$\frac{f_N-f_1}{f_1} = N-1 \quad (4)$$

Thus, the value of N can be properly obtained when there is no offset in nT.

However, in practice, an EFM signal has an offset depending upon nT. This is considered to be caused by variation in the bit length in reproducing a signal from a disc and due to characteristics of an RF amplifier. More specifically, equation (1) becomes the following equation of (5), whereby equation (6) is obtained.

$$\text{width} = \frac{nT}{N} + \Delta Tn(N) \quad (5)$$

$$f_{Nn} = \frac{1}{2\left(\frac{nT}{N} + \Delta Tn(N)\right)} = \frac{N}{2nT+2N\cdot\Delta Tn(N)} \quad (6)$$

Then, $$\frac{f_{Nn}-f_{1n}}{f_{1n}} = \frac{\frac{N}{2nT+2N\cdot\Delta Tn(N)}-\frac{1}{2nT}}{\frac{1}{2nT}} \quad (7)$$

$$= \frac{N}{1+\frac{N\cdot\Delta Tn(N)}{n\cdot T}} - 1$$

An equation corresponding to equations (3) and (4) is expressed by the following equation (8):

$$\frac{f_N-f_1}{f_1} = \sum_{n=3}^{11} P_n \left[\frac{f_{Nn}-f_{1n}}{f_{1n}}\right]_{mean} \quad (8)$$

$$= \sum_{n=3}^{11} P_n \cdot \left(\frac{N}{1+\frac{N\cdot\Delta Tn(N)}{n\cdot T}} - 1\right)$$

$$= \sum_{n=3}^{11} \frac{P_n\cdot N}{1+\frac{N\cdot\Delta Tn(N)}{n\cdot T}}$$

The term of $N\cdot\Delta T_n(N)/n\cdot T$ of the denominator is effective as an error.

In view of the foregoing, when a signal of nT has an offset of $\Delta T_n(N)$, then $$T_{Nn} - T_{1n} = \frac{nT}{N} + \Delta Tn(N) - nT \quad (9)$$

By adding $T_{Nn}$ in offset adder 31 for M samples, then:

$$\sum_{n=1}^{M}[T_{Nn}-T_{1n}] = \frac{1-N}{N}\sum_{n=1}^{M}[nT] + \sum_{n=1}^{M}[\Delta Tn(N)] \quad (10)$$

where, $$\lim_{M\to\infty}\left[\sum_{n=1}^{M}[\Delta Tn(N)]\right] = 0 \quad (11)$$

Therefore, from equation (10), we have:

$$\frac{1-N}{N} = \frac{\sum_{n=1}^{M}[T_{Nn}-T_{1n}]}{\sum_{n=1}^{M}[nT]} \quad (12)$$

In the present invention, the calculation is terminated at M where the denominator $\geq 768T$. N is obtained from the value of the numerator here. According to this method, velocity detection error by $\Delta T_n(N)$ does not appear.

Figure 11:
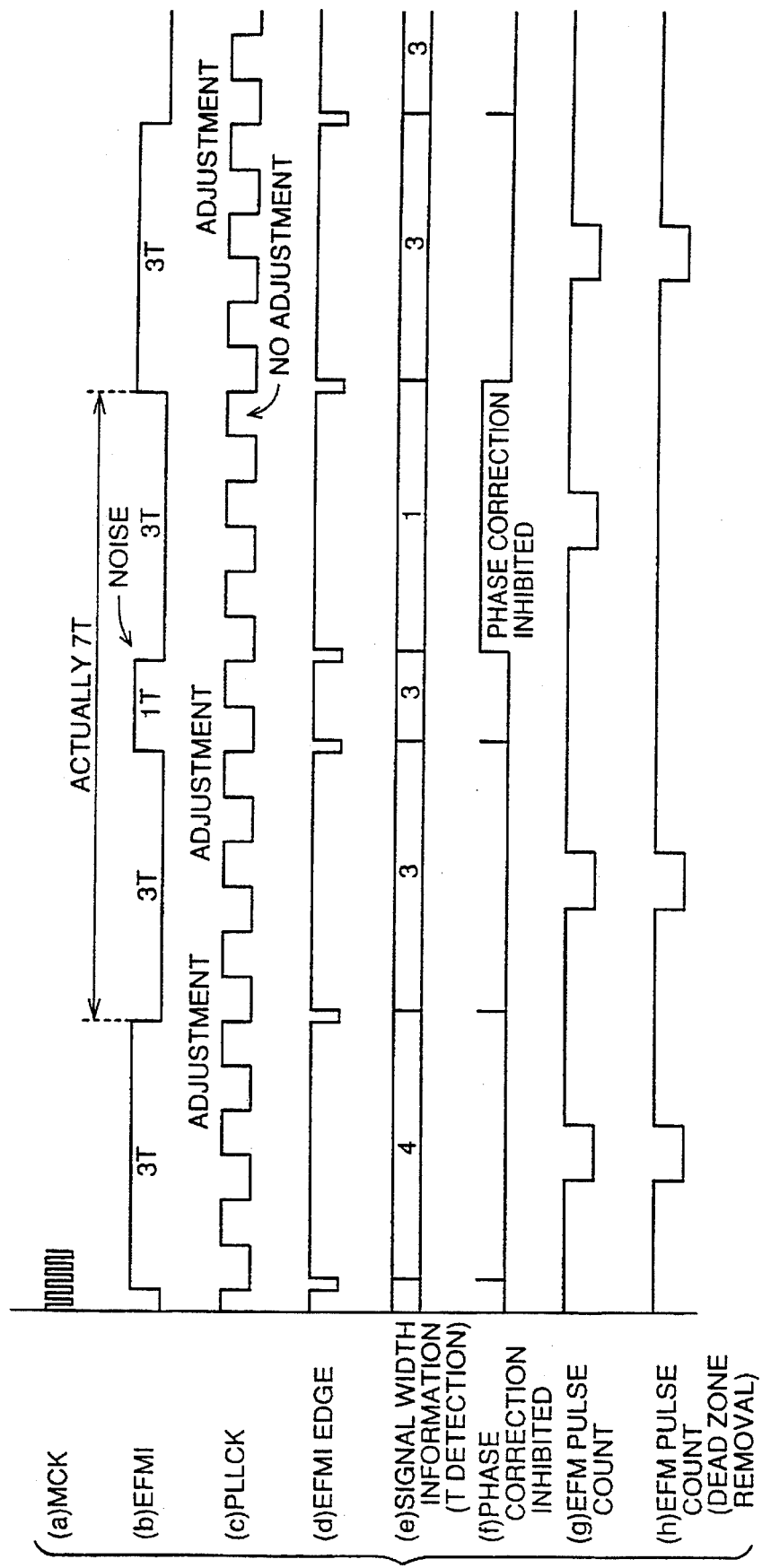
FIG. 11 is a timing chart of the case where a signal that does not exist as 1T–2T is input according to an embodiment of the present invention.

FIG. 11 is a timing chart of a case where a signal such as 1T or 2T is input. When an EFM1 signal that is actually, for example 7T, is altered to 1T by noise as shown in (b) that does not originally exist, a phase correction inhibit signal is provided as shown in (f) to reduce the undesirable effect.

The above embodiments are characterized in that the lock/capture range is enlarged at the expense of some increase in demodulation error at a rough servo mode and that the lock/capture range is restricted at a fine servo mode to reduce error. Therefore, control of a free running frequency with respect to velocity deviation is not carried out. However, this method induces the possibility of significant increase in demodulation error when the locking range exceeds the velocity deviation with great eccentricity of a disc or wow flutter in the spin motor. The following embodiment is directed to reduce such demodulation error.

Figure 12:
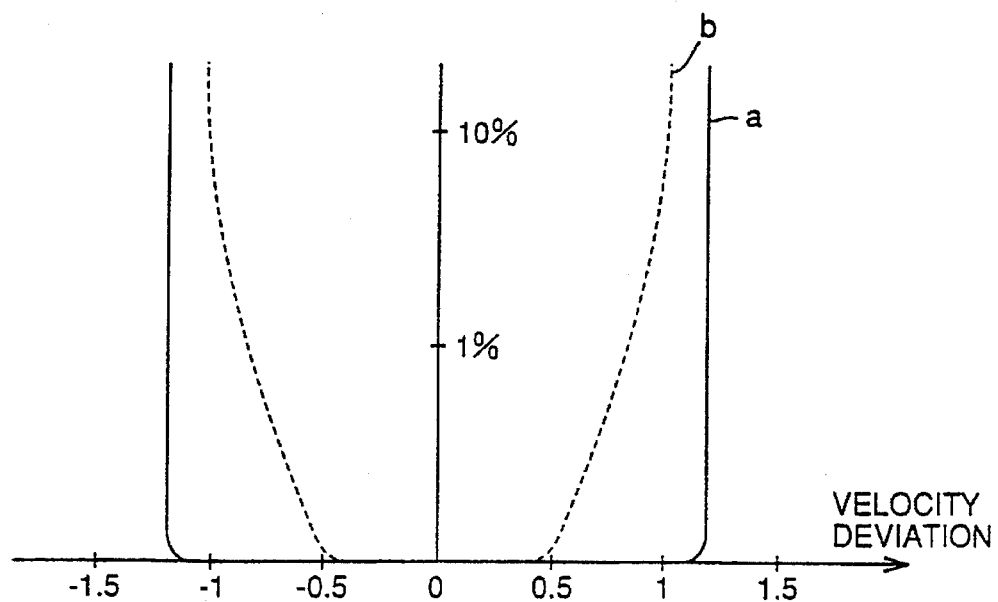
FIG. 12 shows the error rate with respect to speed variation when the table is fixed.

FIG. 12 shows the error rate with respect to velocity deviation when the table is fixed. Referring to FIG. 12, "a" shows the state of free running when there is no jitter in an input EFM signal, and "b" shows the case of an EFM signal including a jitter of approximately 30 nsec. It is appreciated from FIG. 12 that the locking range is restricted as the jitter is greater. In the present embodiment, a method of accommodating a velocity deviation of approximately ±3% even in a fine servo mode will be described hereinafter.

Figure 13:
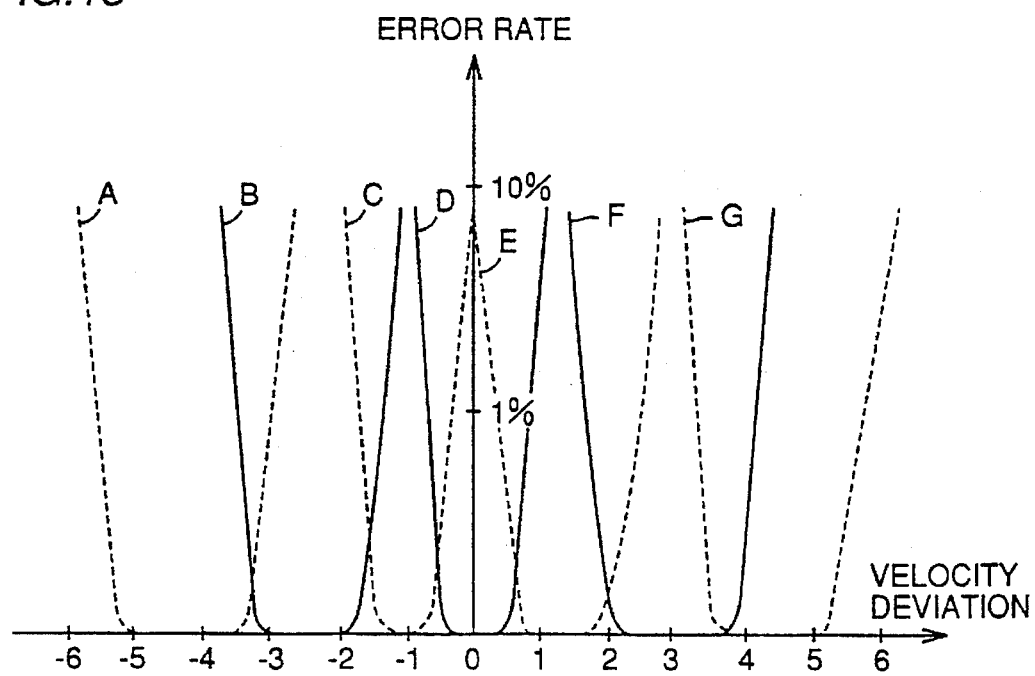
FIG. 13 shows characteristics of velocity deviation in each table at a rough servo mode.
Figure 14:
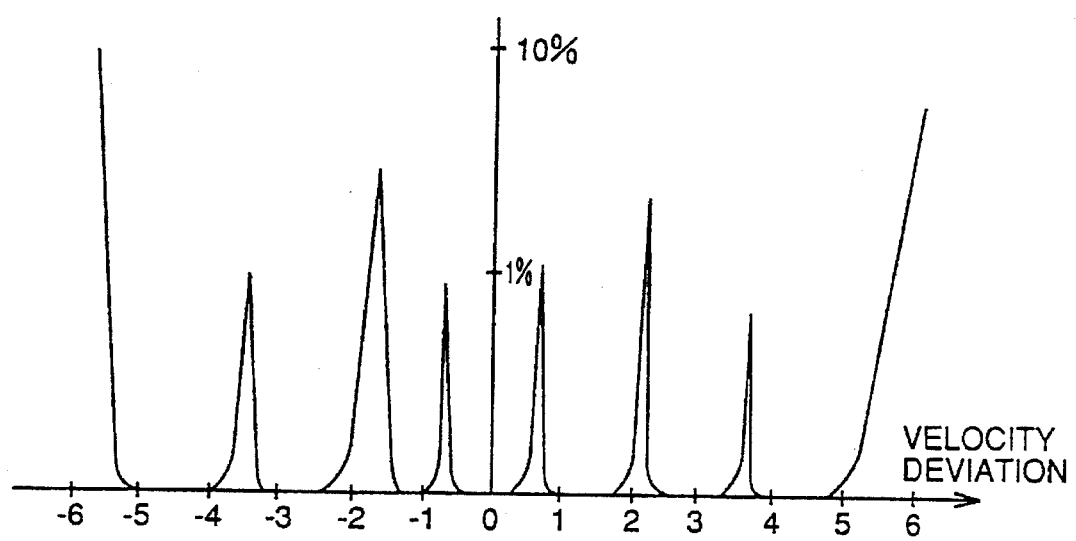
FIG. 14 shows the total characteristics with respect to velocity deviation at a rough servo mode.

FIG. 13 shows the error rate with respect to velocity deviation of each of A–G when the velocity correction of A–G of FIG. 8 is carried out. Assuming that the jitter in FIG. 13 is approximately 30 nsec., switching the table according to information of the velocity detector will exhibit increase in error in the vicinity of the table switching point as shown in FIG. 14. This is because the switching point is located at the border end of the two tables. In the present embodiment, table switching is made variable even at a fine servo mode, and the overlapping area of the usable range of each table is increased. The table switching point is set where an error rate of a sufficiently small level is ensured.

Figure 15:
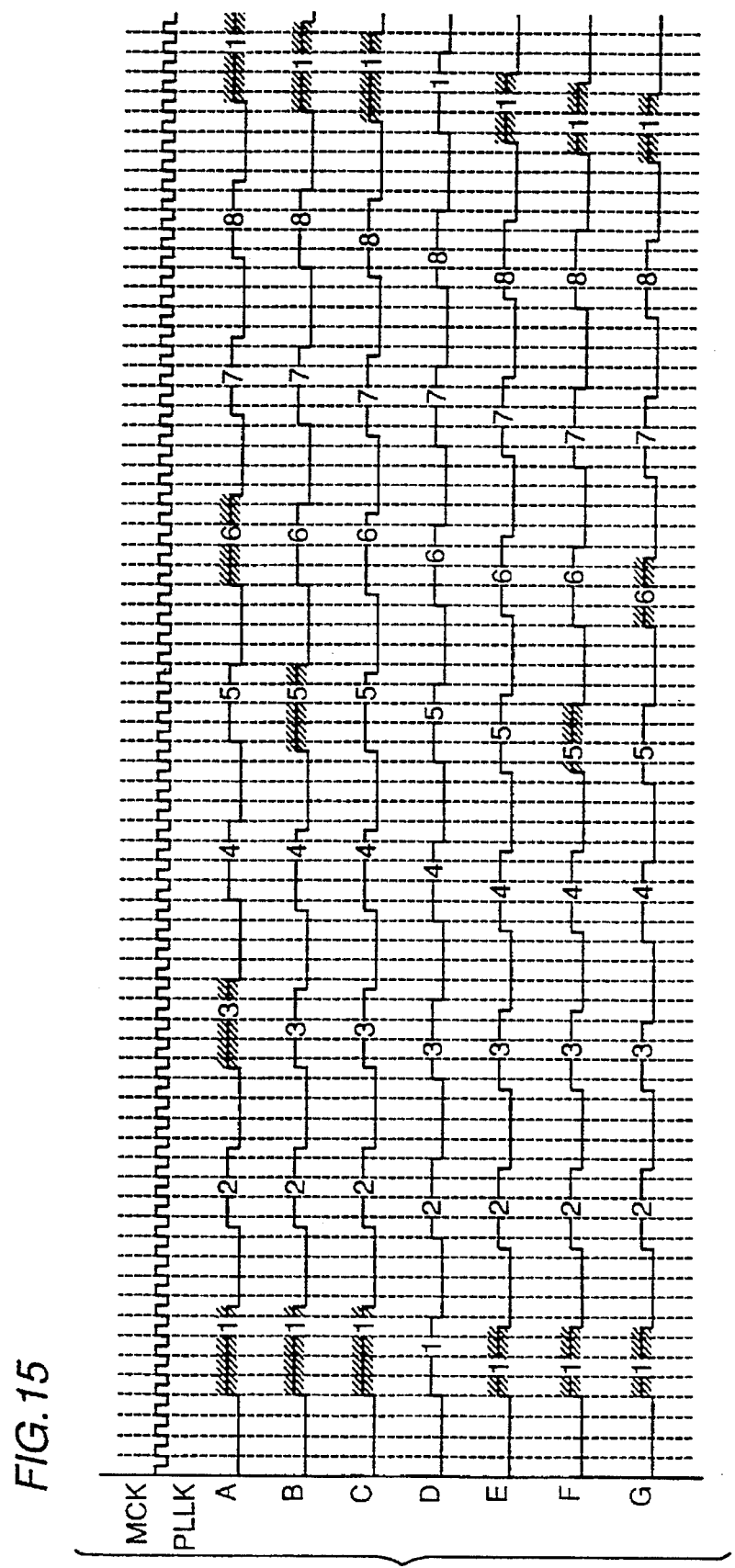
FIG. 15 shows variation in the average frequency of a PLL clock signal.
Figure 16:
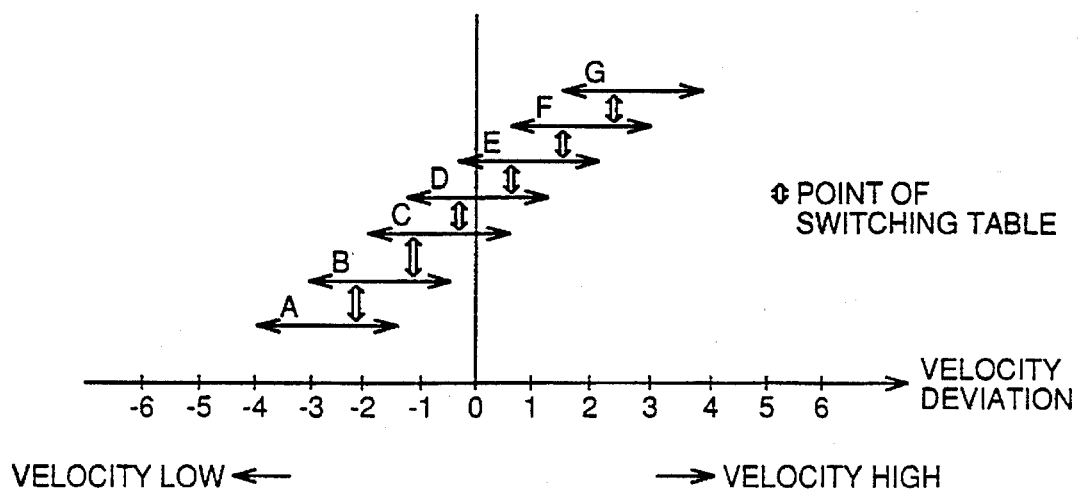
FIG. 16 shows a point of switching the table according to another embodiment of the present invention.

FIG. 15 is a waveform diagram of a PLL clock according to another embodiment of the present invention. The waveform of FIG. 15 differs from the waveform at a rough servo mode of FIG. 8 in that correction of the pulse width is carried out in steps of half a period of a master clock signal MCK. FIG. 16 shows the switching point of a relevant table.

Figure 17:
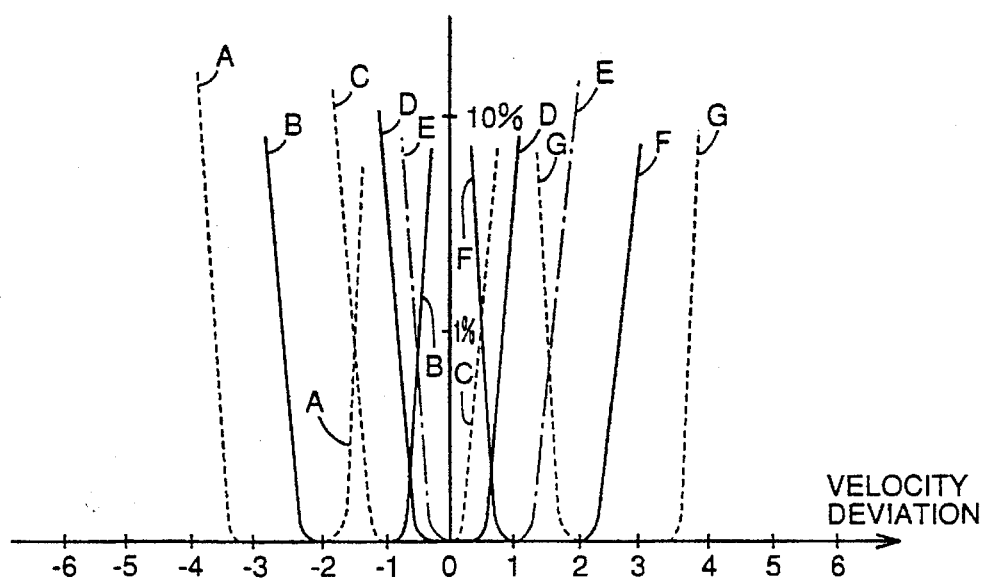
FIG. 17 shows characteristics with respect to velocity deviation of each table at a fine servo mode.
Figure 18:
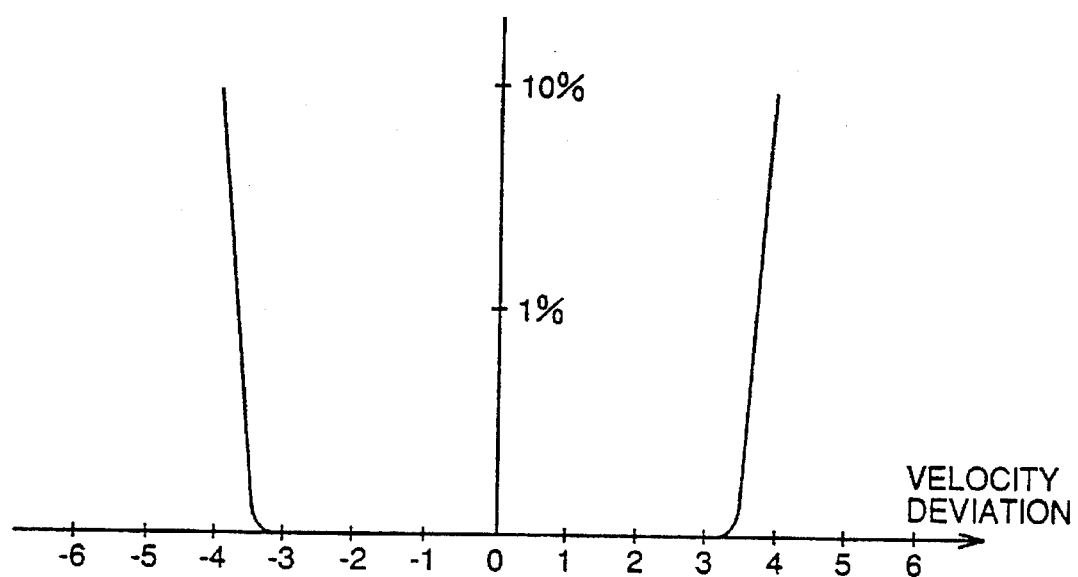
FIG. 18 shows the total characteristics with respect to velocity deviation in a fine servo mode.

FIG. 17 shows the error rate with respect to velocity deviation of each of A–G when the velocity correction of A–G according to the clock waveform of FIG. 15 is carried out. FIG. 18 shows the table switched according to the information of the velocity detector. It is appreciated from FIG. 18 that the error rate can be reduced to 0 from at least ±3%.

Figure 19:
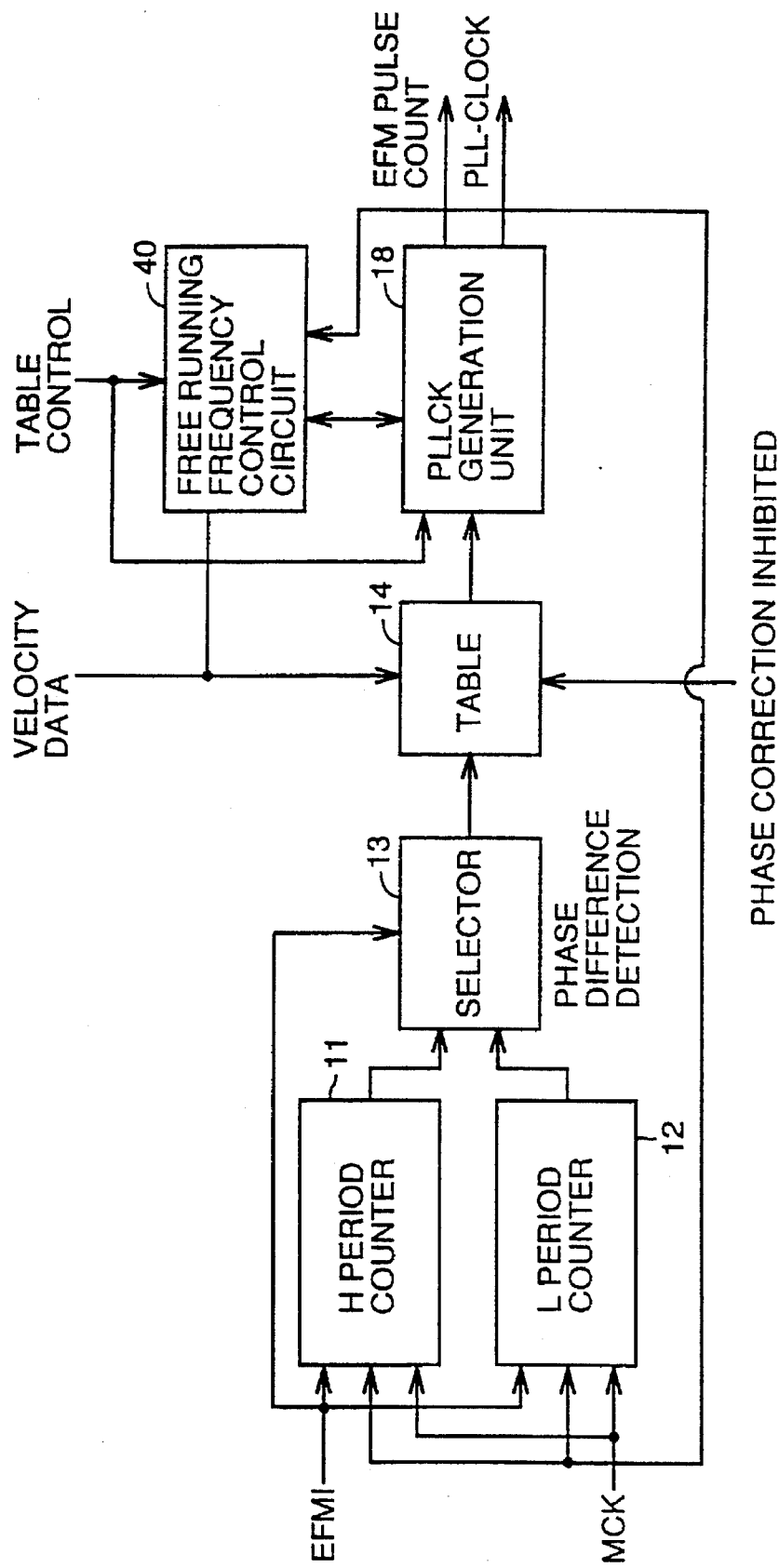
FIG. 19 is a block diagram showing a PLL circuit according to another embodiment of the present invention.

FIG. 19 is a block diagram of another embodiment of the present invention. In contrast to the phase control circuit shown in FIG. 4, the present embodiment of FIG. 19 has table 15 and selector 16 removed. An output of counter 11 or 12 selected by selector 13 is directly provided to table 14, and the output of table 14 is provided to PLL clock generation unit 18. Free running frequency control circuit 40 receives a table control signal indicating a rough/fine servo mode and velocity data.

Figure 20:
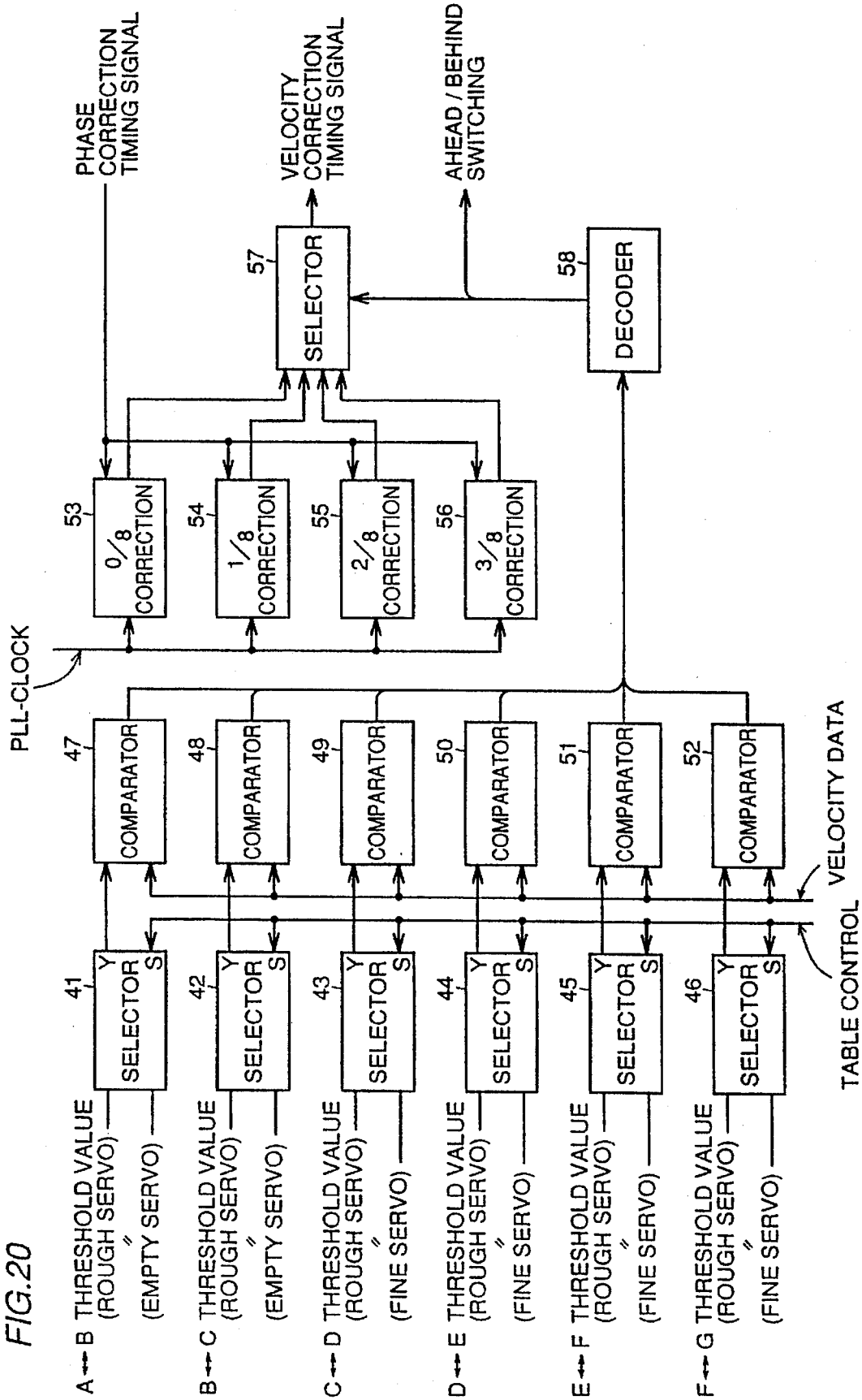
FIG. 20 is a block diagram of a free running frequency control circuit of FIG. 19.

FIG. 20 is a block diagram showing free running frequency control circuit 40 of FIG. 19. Referring to FIG. 20, a free running frequency control circuit 40 includes selectors 41–46, comparactor 47–52, correction circuits 53–56, a selector 57, and a decoder 58. Selectors 41–46 select a threshold value according to a table control signal that changes according to a rough servo mode and a fine servo mode. Comparactor 47–52 compare a threshold value provided from selectors 41–46 with velocity data. The threshold value is as shown in the previous FIGS. 9 and 16. The comparison result of comparators 47–52 are provided to decoder 58 to be decoded. The decoded output is provided to selector 57.

Correction circuits 53–56 generate a timing signal for correcting 0, 1, 2, and 3 of the eight PLL clock signals. The timing signal is provided to selector 57. Selector 57 responds to a decoded output signal from decoder 58 to select a timing signal output from any of correction circuits 53–56. The selected timing signal is output as a velocity correction timing signal.

Correction circuits 53–56 respond to a phase correction timing signal to carry out velocity correction excluding the period of a PLL clock signal for phase correction. Selector 57 transfers to PLL clock generation unit 18 shown in FIG. 19 a signal indicating whether the velocity deviation is ahead or behind the standard velocity. PLL clock generation unit 18 generates a PLL clock signal for velocity correction of FIG. 8 or 15 according to a velocity correction timing signal, an ahead/behind switching signal, and a table control signal.

According to the present embodiment, the degree of offset of an EFM input signal from the standard transfer rate is determined at a plurality of stages. The frequency of altering the frequency rate from which a PLL clock signal is generated is varied according to each stage. Switching is carried out between two types of determination standard values at a rough servo mode and a fine servo mode. At a fine servo mode, the determination stage of the offset level is provided in a plurality of close steps. The number of the entire determination stages is set equal in a fine servo and a rough servo mode. The amount of change in the frequency rate is also altered in a rough servo mode and a fine servo mode with respect to the determination standard value. By reducing the amount of change at a fine servo mode, the average frequency of a PLL clock signal with respect to velocity deviation is altered very smoothly. The capture/lock range can be enlarged without degrading the error rate.

Figure 21:
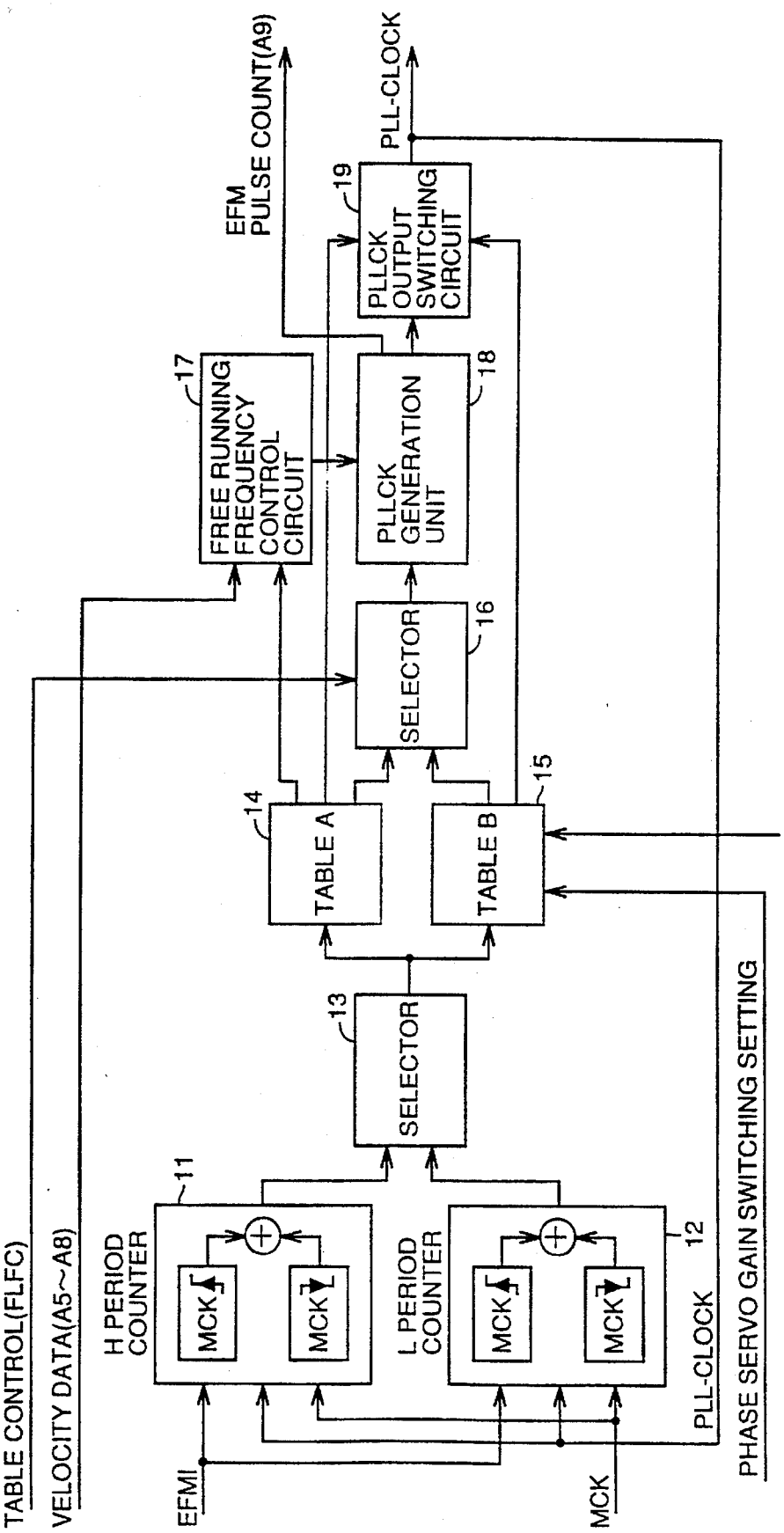
FIG. 21 is a block diagram of a PLL circuit according to a further embodiment of the present invention.

FIG. 21 is a block diagram showing still another embodiment of the present invention. The present embodiment is directed to control a PLL clock signal in units of half a period of master clock signal MCK. The present embodiment is similar to that of FIG. 4 except for the elements set forth in the following. That is to say, tables 14 and 15 generate a control signal for controlling a PLL clock signal at every half period of a master clock signal MCK. The generated control signal is provided to PLL clock output switching circuit 19. According to a PLL clock signal generated by PLL clock generation unit 18 and a PLL clock output control signal provided from tables 14 and 15, PLL clock output switching circuit 19 provides a PLL clock signal selecting either a rising or falling edge of a master clock signal MCK as the changing point of a PLL clock. For example, when a PLL clock output control signal attains an L level, the period of the PLL clock signal changes at a rise of master clock signal MCK. When the PLL clock output control signal attains an H level, the period of the PLL clock signal changes at a fall of master clock signal MCK.

Figure 22:
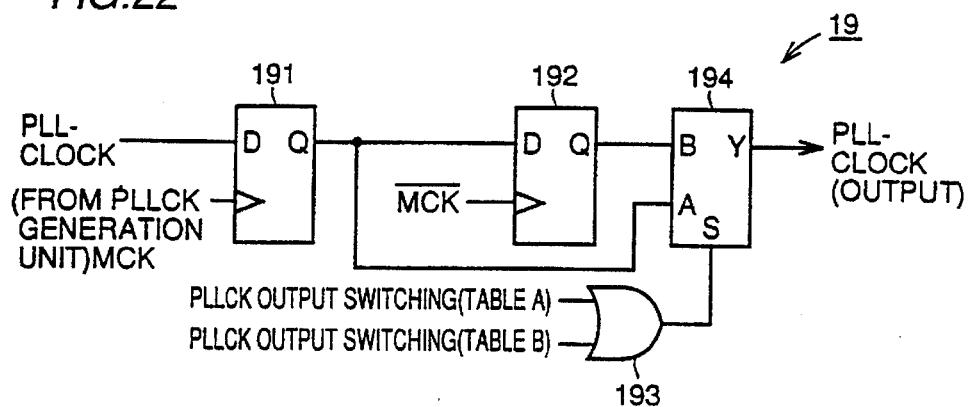
FIG. 22 is a block diagram showing an example of the PLL clock output switching circuit of FIG. 21.

FIG. 22 is a block diagram showing an example of the PLL clock output switching circuit of FIG. 21. Referring to FIG. 22, a PLL clock signal provided from PLL clock generation unit 18 is latched at a rise of master clock signal MCK by a D flipflop 191. The output of D flipflop 191 is latched at a fall of master clock signal MCK by a D flipflop 192. An OR gate 193 takes an inclusive OR of a PLL clock output switching signal from table A14 and a PLL clock outputs switching signal from a table B15. A selector 194 responds to the inclusive ORed result of OR gate 193 to select an output of D flipflop 191 or D flipflop 192. The selected output is provided as a PLL clock signal.

Figure 23:
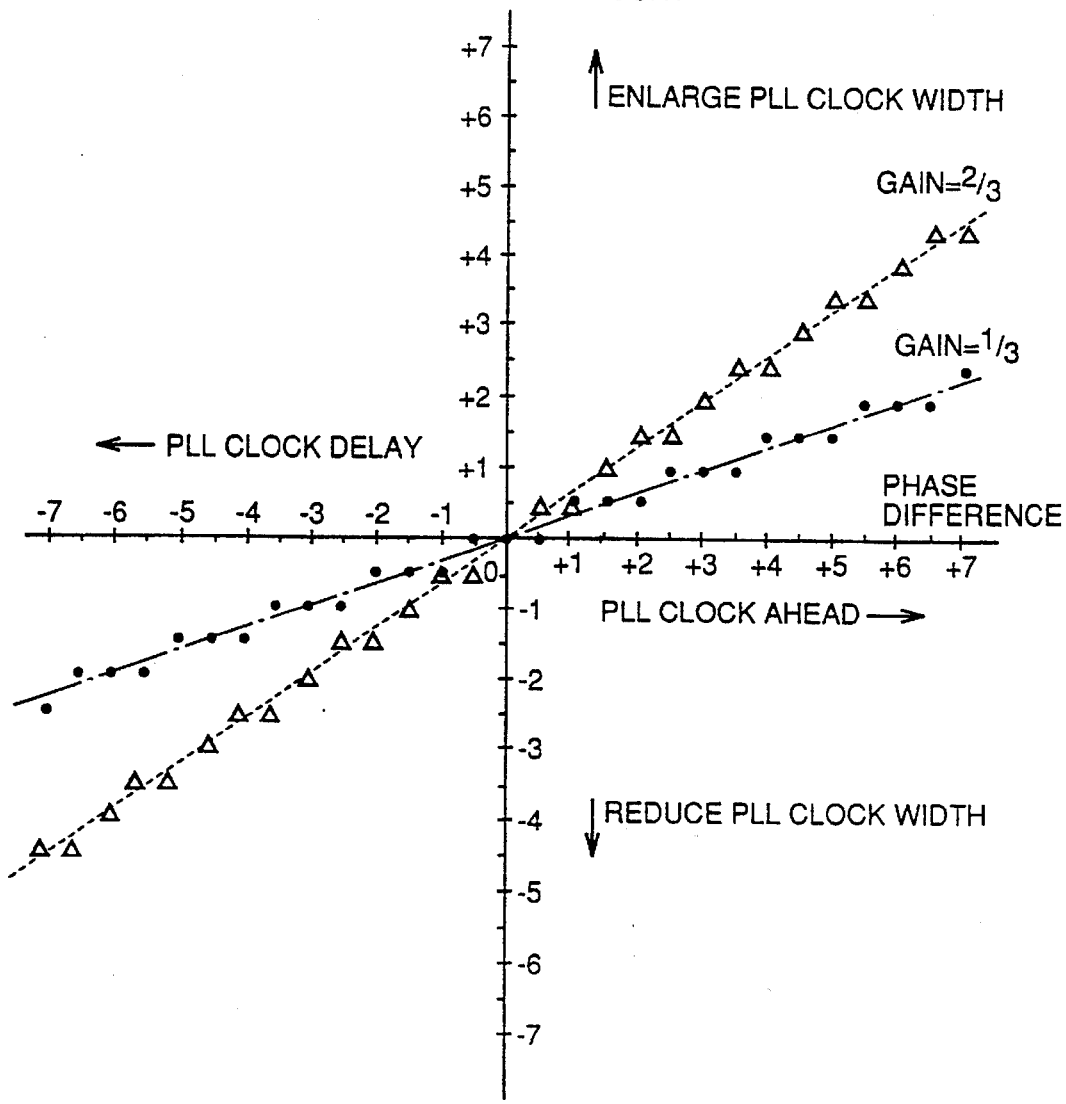
FIG. 23 shows the relations p between a PLL clock signal and the amount of correction when correction is carried out at every half period of a fixed frequency generated at an oscillating circuit of FIG. 23.

FIG. 23 shows the relationship between a clock signal and the corrected amount when correction is carried out at every half period of a fixed frequency generated by an oscillator.

Figure 10:
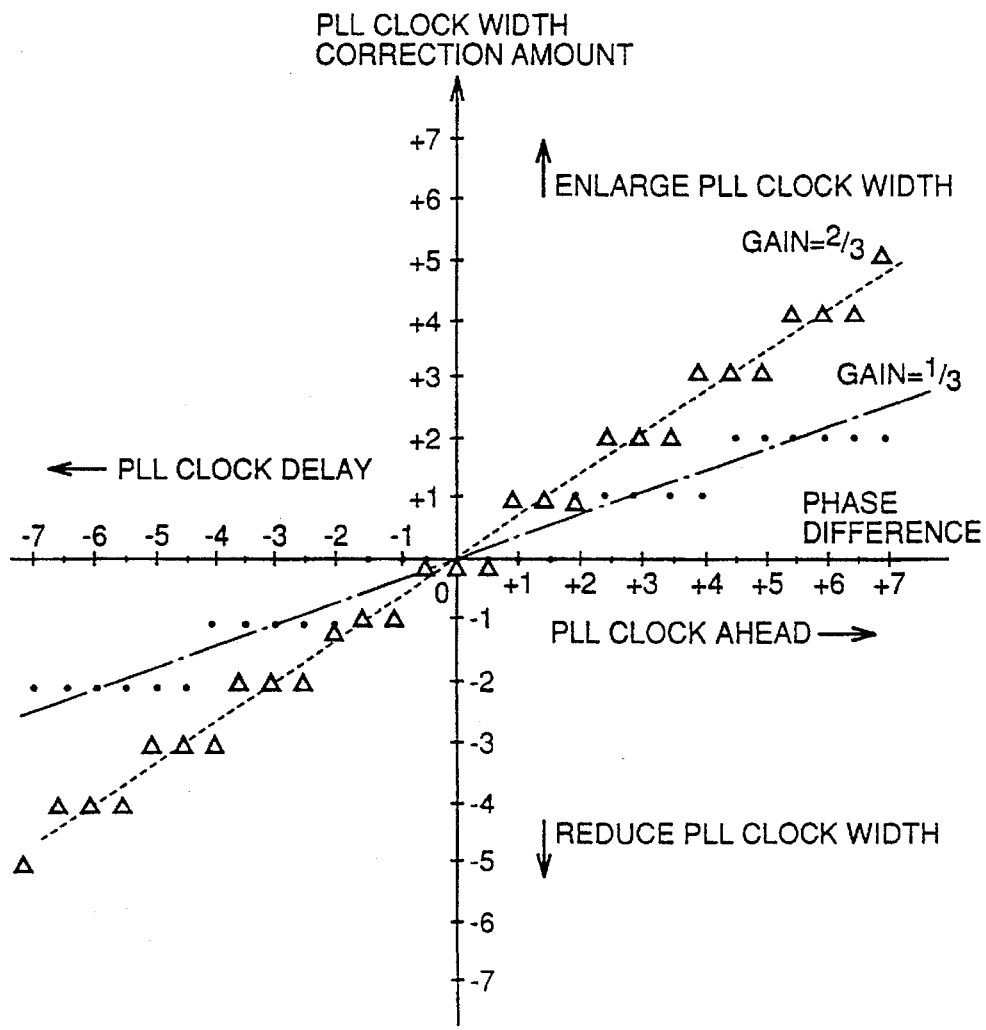
FIG. 10 shows the width of an input and corrected PLL clock signal.

It is appreciated by comparing FIGS. 10 and 23 that the embodiment of FIG. 21 reduces correction error by controlling a PLL clock signal in units of half a period of master clock signal MCK.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital PLL circuit for producing a phase locked clock signal comprising: a phase control circuit to count a phase difference between said phase locked clock signal generated by a clock signal generator and an input signal for producing a phase difference count to control a frequency rate of said clock signal generator according to the phase difference count, means coupled to said clock signal generator and said phase control circuit for varying said frequency rate with respect to the phase difference count, wherein said means provides variation of the relation of phase difference count versus said frequency rate according to a level of litter in said input signal, and wherein said means sets said phase difference count versus said frequency rate to an optimum value according to the level of jitter of said input signal.

2. The digital PLL circuit according to claim 1, further comprising:
   pulse width counting means for counting a pulse width of said input signal, and
   control means responsive to an output of said pulse width counting means for detecting offset of said input signal from a predetermined standard transfer rate for enlarging a lock range/capture range of the PLL circuit by changing said frequency rate to alter an average frequency of the phase locked clock signal.

3. The digital PLL circuit according to claim 2, wherein said control means enlarges the lock range/capture range by detecting offset of said input signal from the predetermined standard transfer rate to increase the relationship of said phase difference count versus said frequency rate.

4. The digital PLL circuit according to claim 3, wherein said pulse width counting means counts whether the pulse width of said input signal is a predetermined width, and
   wherein said control means detects the amount of offset of the pulse width at said predetermined standard transfer rate.

5. The digital PLL circuit according to claim 1, further including a master clock for producing a fixed frequency output wherein said phase locked clock signal is a frequency divided version of the fixed frequency output and wherein said means adjusts a changing point of said phase locked clock signal in units of half a period of said fixed frequency output.

6. The digital PLL circuit according to claim 1, further including a master clock for producing a fixed frequency output wherein said phase locked clock signal is a frequency divided version of the fixed frequency output and wherein said phase control circuit counts the phase difference between said input signal and said phase locked clock signal using either a rising or a falling edge of said fixed frequency output.

7. The digital PLL circuit according to claim 1, wherein said means delays an output changing timing of said phase locked clock signal by half a period of a fixed frequency by a value of said phase difference.

8. The digital PLL circuit according to claim 1, wherein said means selects an output changing timing of said phase locked clock signal from a rise or fall of a fixed frequency by a value of said phase difference.

9. A digital PLL circuit comprising:
   a phase control circuit for counting a phase difference between a clock signal generated by a clock signal generator and an input signal to produce a phase difference count for obtaining synchronization of said input signal and said clock signal by controlling a frequency rate according to the phase difference count, wherein the relationship of said frequency rate versus said phase difference count is variable,
   pulse width counting means for counting pulse widths of said input signal,
   pulse width detecting means for detecting whether a pulse width counted by said pulse width counting means is a predetermined width of 3T–11T, where T is a predetermined number of periods of said clock signal and
   offset detecting means coupled to said phase control circuit for detecting an amount of offset of said input signal from a standard transfer rate by adding the amount of offset of said input signal from the standard transfer rate according to the pulse width counted by said pulse width counting means, and dividing the added amount by an added value of the detection result of said pulse width detecting means.

10. The digital PLL circuit according to claim 9, wherein said pulse width detecting means responds to detection of a signal having a pulse width not within a predetermined range of the widths 3T–11T for invalidating the input signal.

11. The digital PLL circuit according to claim 10, wherein a phase correction operation of said input signal at the next period is inhibited when said pulse width detecting means detects a signal having a pulse width smaller than 3T.

12. The digital PLL circuit according to claim 11, further comprising:
   determination means for making determination of an offset of said input signal from the standard transfer rate at a plurality of stages, and
   means responsive to each stage determined by said determination means for altering the changing frequency of said frequency rate.

13. The digital PLL circuit according to claim 12, wherein said determination means comprises switching means for switching between two types of determination standard values in making determination of said degree of offset at said plurality of stages.

14. The digital PLL circuit according to claim 13, wherein the means for altering alters the amount of change of said frequency rate with respect to said determination standard value.

15. A digital phase locked loop circuit comprising,
   a phase difference detection circuit for counting a phase difference between a phase locked clock signal generated by a phase locked clock generating unit and an input signal, to produce a phase difference count,
   a first table responsive to the phase difference count for producing data for changing an average frequency of the phase locked clock signal, the relationship between the phase difference counts and the data for changing within the first table being varied by a shift control signal input to the first table to provide an increase in the locking range for the phase locked loop circuit,
   means for receiving, the data for changing the average frequency of the phase locked clock signal of said phase locked clock generating unit to control the average frequency of said phase locked clock signal and a locking range of the digital phase locked loop circuit, wherein said phase locked clock signal in synchronization with said input signal is output and is fed back to said phase difference detection circuit.

16. A digital phase locked loop circuit as in claim 15 including a second table, wherein said second table is responsive to said phase difference count for providing control data for the average frequency to the phase locked clock generating unit that is variable as a function of the measure of the level of jitter in said input signal in a different mode of operation.

17. A digital phase locked loop circuit as in claim 16 wherein an inhibit signal is applied to said second table to inhibit it from providing the control data for the average frequency to the phase locked clock generating unit when the input signal is less than a predetermined width.

* * * * *